United States Patent [19]  
Harris et al.

[11] Patent Number: 4,721,540  
[45] Date of Patent: Jan. 26, 1988

[54] LOW DENSITY SINGLE CRYSTAL SUPER ALLOY

[75] Inventors: Kenneth Harris, Spring Lake; Gary L. Erickson, Muskegon, both of Mich.

[73] Assignee: Cannon Muskegon Corporation, Muskegon, Mich.

[21] Appl. No.: 677,797

[22] Filed: Dec. 4, 1984

[51] Int. Cl.⁴ .................................................. B22B 27/06
[52] U.S. Cl. .......................................... 148/404; 148/3; 148/162; 148/410; 416/241 R; 420/448
[58] Field of Search .................... 148/404, 3, 162, 410; 420/448; 416/241 R

[56] References Cited

U.S. PATENT DOCUMENTS

| | | | |
|---|---|---|---|
| 4,222,794 | 9/1980 | Schweizer | 148/404 |
| 4,402,772 | 9/1983 | Duhl et al. | 148/404 |
| 4,459,160 | 7/1984 | Meetham et al. | 148/410 |
| 4,543,235 | 9/1985 | Lemkey et al. | 148/404 |
| 4,582,548 | 4/1986 | Harris et al. | 148/404 |

Primary Examiner—Stephen J. Lechert, Jr.
Attorney, Agent, or Firm—Price, Heneveld, Cooper, DeWitt & Litton

[57] ABSTRACT

A single crystal nickel alloy is provided having many of the foundry and performance characteristics of the higher density, single crystal, nickel base super alloys from which the vanes and blades are cast for high performance turbine aircraft engines. The lower density of this alloy permits its use for rebuilding and upgrading the performance of older turbine aircraft engines of designs which cannot withstand the centrifugal forces generated by the new state of the art higher density single crystal super alloys. The alloy for the first time provides a lower density single crystal alloy capable of heat treatment to stabilize its microstructure for high temperature, high stress use. It also provides for the first time a lower density alloy having acceptable resistance to the effects of high temperature sulfidation, salt corrosion and also to have good coating life. By significant changes in the alloy composition the resulting alloy has creep rupture and stress rupture performance characteristics similar to that of the high density nickel base super alloys while maintaining a density characteristic of equiaxe alloys.

4 Claims, 20 Drawing Figures

FIG. 1    100X
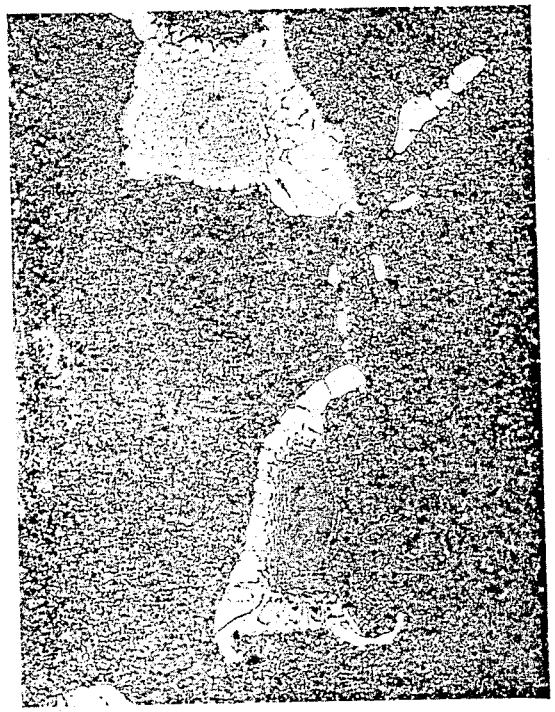
FIG. 1A    400X
FIG. 2    100X
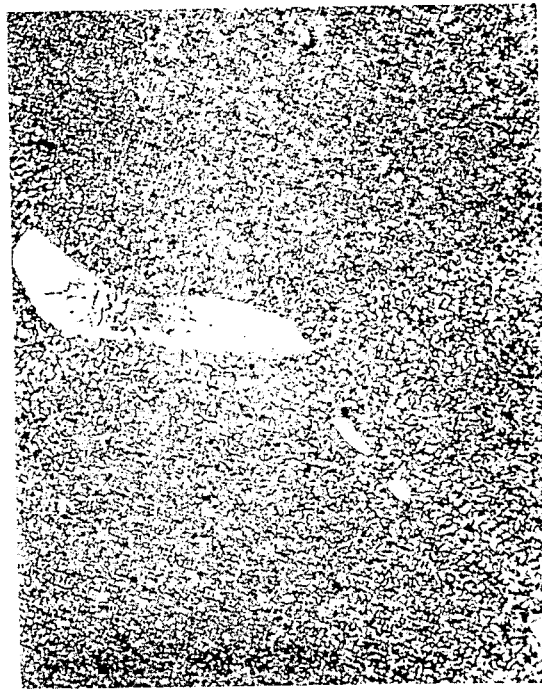
FIG. 2A    400X

FIG. 3　100 X
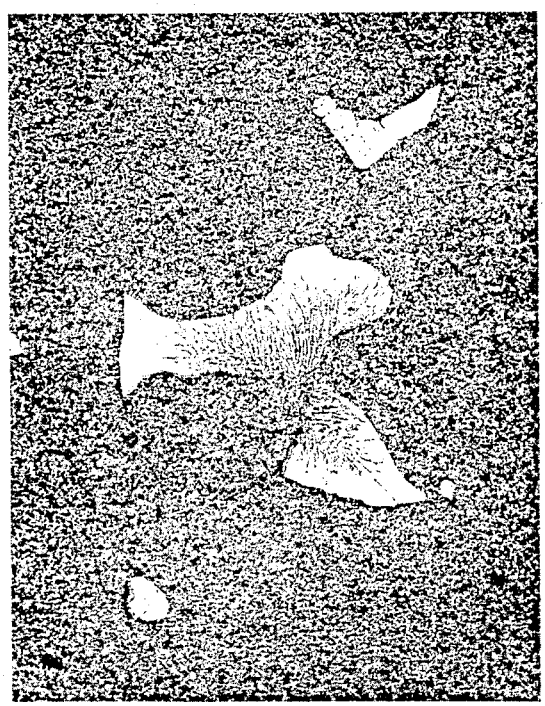
FIG. 3A　400X
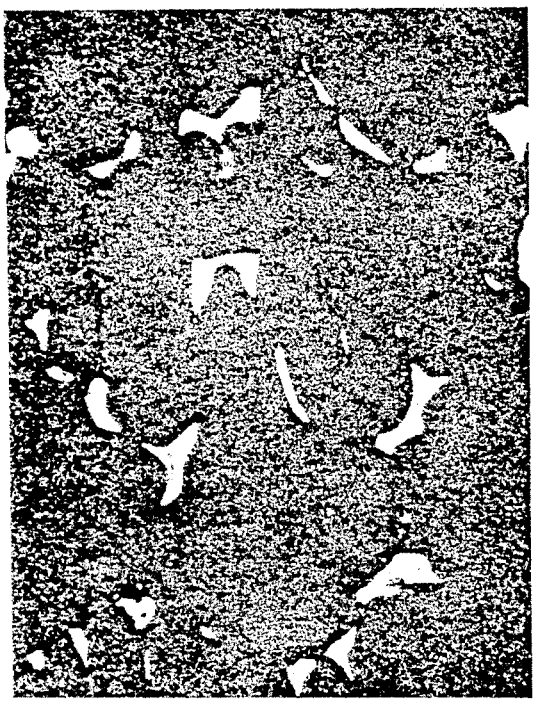
ROOT　FIG. 4　100X
AIRFOIL　FIG. 4A　100X

NEAR FRACTURE  400X

COMPARISON OF BURNER RIG SULFIDATION

THREAD SECTION  400X

COMPARISON OF CYCLIC OXIDATION

NEAR FRACTURE 400X

NEAR FRACTURE 400X

NEAR FRACTURE 400X

THREAD SECTION 400X

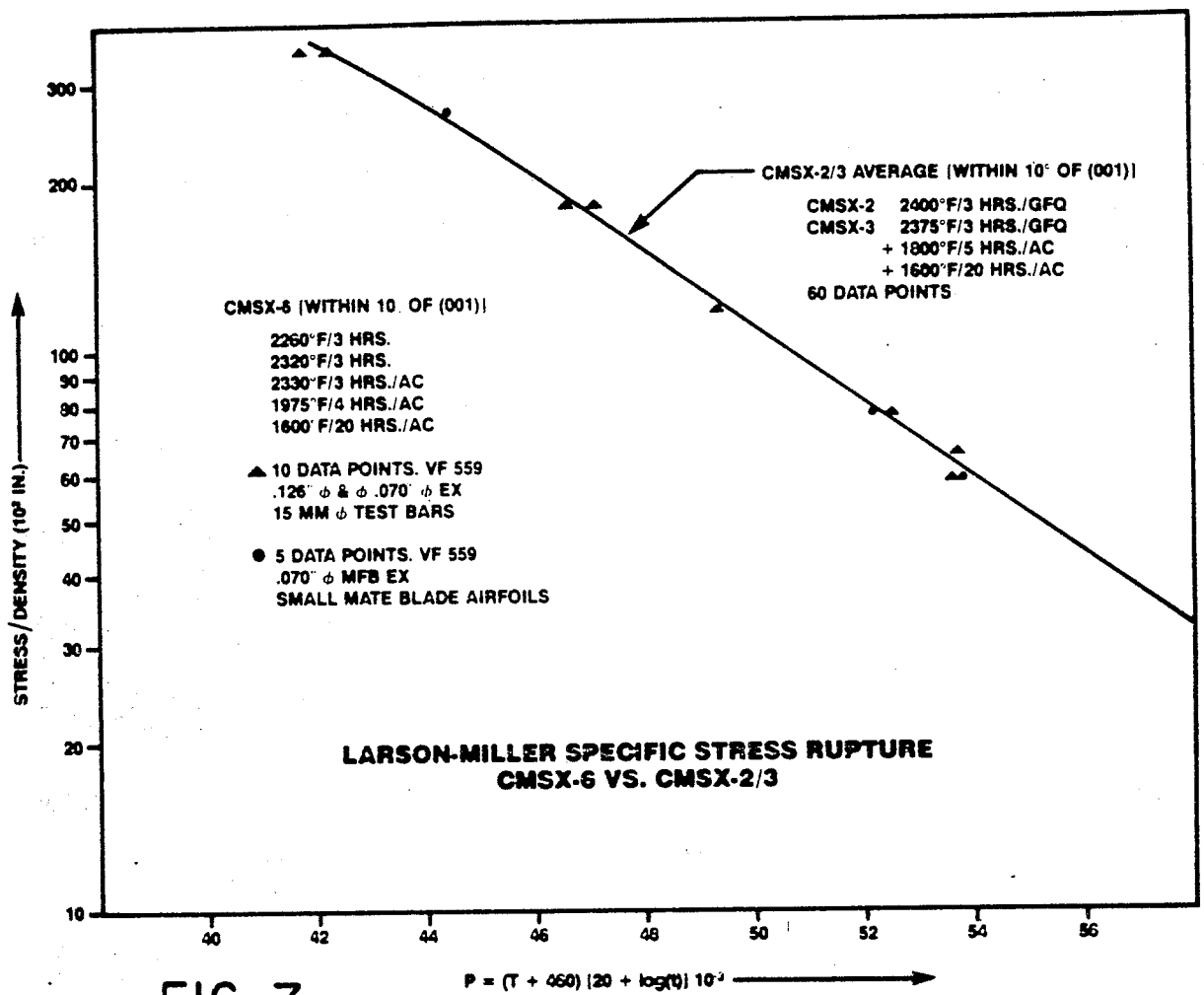
FIG. 7
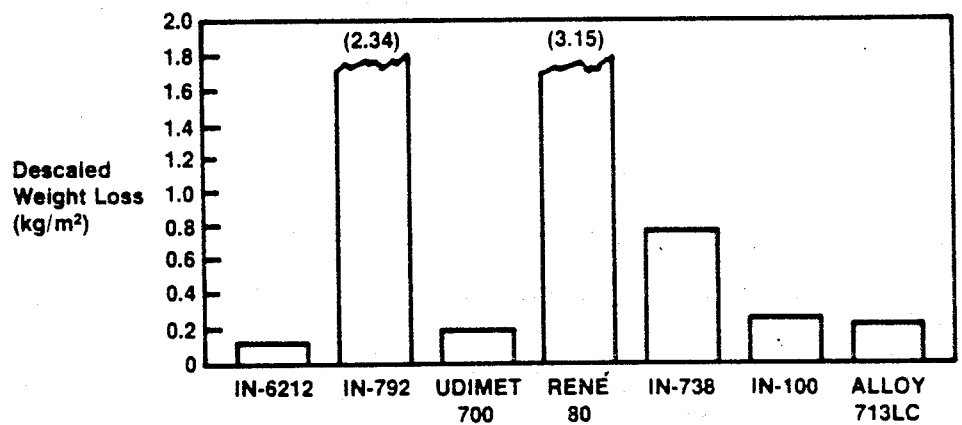
FIG. 13  Oxidation Resistance: 504h, 1100°C (2012°F)
Air + 5% $H_2O$, 24h cycle to room temperature    Ref. 9

COMPARISON OF BURNER RIG SULFIDATION RESISTANCE OF EQUIAXE IN-6212 WITH OTHER EQUIAXE SUPERALLOYS

Sulfidation Resistance: 168h, 930°C (1700°F) 58 min.
Air Blast 30.1 Air + 5 ppm Sea Water to Fuel
(0.3% S, JP-5) Ratio Ref. 9

COATING LIFE
STATIC 850°C [1562°F] SALT HOT CORROSION/
1000°C [1832°F] OXIDATION

Ref 7.

Pt ALUMINIDE COATING
TOTAL COATING THICKNESS 45 μm [1.8 mil]

LOW DENSITY SINGLE CRYSTAL SUPER ALLOY

FIELD OF THE INVENTION

This invention relates to a nickel base, single crystal super alloy, particularly such an alloy having a relatively low density. The alloy of this invention belongs to that group of super alloys capable of high temperature, high stress operation, the primary application of which is for turbine blade castings for aircraft turbine engines.

BACKGROUND OF THE INVENTION

It is increasingly important that aircraft turbine engines have a long life. Increased operating costs, e.g. fuel price escalation, enhance the importance of engine life consideration and materially reduce the desirability of continuing to use old engines even though they are functionally sound. However, the cost of replacing such engines is quite high and, therefore, impractical.

Among the factors which have improved the efficiency of new technology engines is the ability of the turbine alloys used in these engines to operate at higher temperatures and stress. This increased efficiency results significantly from the substitution of single crystal super alloys for equiaxe super alloys. However, the new single crystal alloys are generally more dense, with such components, therefore, generating centrifugal forces which potentially exceed design limitations of some of the older engines in service.

The structures of some of the older turbine engines, including turbine discs, shafts, bearings and supports are not capable of withstanding the centrifugal forces of the newer, more dense high performance single crystal super alloys at the speeds which make the use of such alloys advantageous. Thus, the speed of the engines must be reduced, thereby negating the potential efficiency upgrading which would otherwise justify rebuilding such engines. With older engines, this tends to further reduce the desirability of rebuilding them. In the case of engines of more recent design, this approach can negate or largely negate the engine's potential for functional improvement.

BRIEF DESCRIPTION OF THE INVENTION

This invention provides a lower density super alloy capable of use for casting single crystal turbine blades. This is accomplished while retaining many of the desirable functional characteristics of the more dense, high performance single crystal super alloys which are now used in newer engines which were initially designed to withstand the higher centrifugal forces resulting from their use. The alloy of this invention solves other problems which have heretofore defeated efforts to reduce the density of single crystal super alloys without loss of critical characteristics. The super alloy of this invention has good foundry characteristics and retains a heat treatment window great enough to permit heat treatment that effects total solutioning of the gamma prime and substantial solutioning of the gamma/gamma prime eutectic without any incipient melting. From the results of an initial test the alloy is reasonably expected to exhibit good environmental characteristics.

The invention is able to produce the desired reduction in alloy density by partial replacement of refractory metals by increasing the Al+Ti content, as well as by very strict control of the unintentional addition of impurities.

BRIEF DESCRIPTION OF THE DRAWINGS

FIG. 1 is a photomicrograph of an as-cast test specimen from a single crystal test bar cast from the alloy of this invention taken at 100X;

FIG. 1A is a photomicrograph of the same specimen as FIG. 1 taken at 400X;

FIG. 2 is a photomicrograph of an as-cast test specimen from the root section of a single crystal turbine blade cast from the alloy CMSX-3 taken at 100X;

FIG. 2A is a photomicrograph of the same specimen as FIG. 2, taken at 400X;

FIG. 3 is a photomicrograph of a test specimen similar to that shown in FIGS. 1 and 1A after solution heat treatment, taken at 100X;

FIG. 3A is a photomicrograph of the same specimen as FIG. 3, taken at 400X;

FIG. 4 is a photomicrograph of a test specimen from the root section of a solid turbine blade cast from the alloy of this invention after solution heat treatment, taken at 100X;

FIG. 4A is a photomicrograph of the same blade as FIG. 4 from the airfoil section, after solution heat treatment, taken at 100X;

FIG. 7 is a Larson-Miller specific (density corrected) stress-rupture plot of the data obtained from stress rupture tests;

FIG. 13 is a chart of oxidation resistance tests performed on several nickel base alloys.

DESCRIPTION OF THE PREFERRED EMBODIMENT

The alloy composition of previously developed conventionally cast, low density, equiaxed alloys and their characteristics were first investigated. The initial alloy studied was IN 100 having a density of 0.280 lbs/cu. in. (7.76 gms/cc). The nominal composition of IN 100 alloy is (wt/%):

| | | | |
|---|---|---|---|
| C | 0.17 | Al | 5.50 |
| Cr | 9.0 | Ti | 4.75 |
| Co | 15.0 | B | 0.015 |
| Mo | 3.0 | Zr | 0.06 |
| V | 0.9 | Ni | Balance |

| | | | |
|---|---|---|---|
| -continued | | | |
| Density | 0.280 lbs./cu. in. | | |
| | (7.76 gms/cc) | | |

This alloy was developed by International Nickel in the early 1960's for equiaxe casting technology and is therefore a forerunner of the modern groups of nickel base, single crystal alloys which make possible the new generation of high efficiency, high performance turbine engines. It is not suitable for the latest generation of aircraft turbine engines but is still widely used for low density, conventionally equiaxe cast turbine blades in older turbine engines.

This alloy has a number of shortcomings, among which are poor castability due to hot tearing and cracking and high, undesirable levels of microporosity. It also has poor environmental properties. The vanadium and molybdenum in IN 100 alloy are found to dissolve in the molten sodium sulphate coating which is deposited on the turbine blades as a result of sulphur in the fuel and salt environment encountered in turbine engine applications. This prevents the formation of a protective oxide film.

Figure 12:
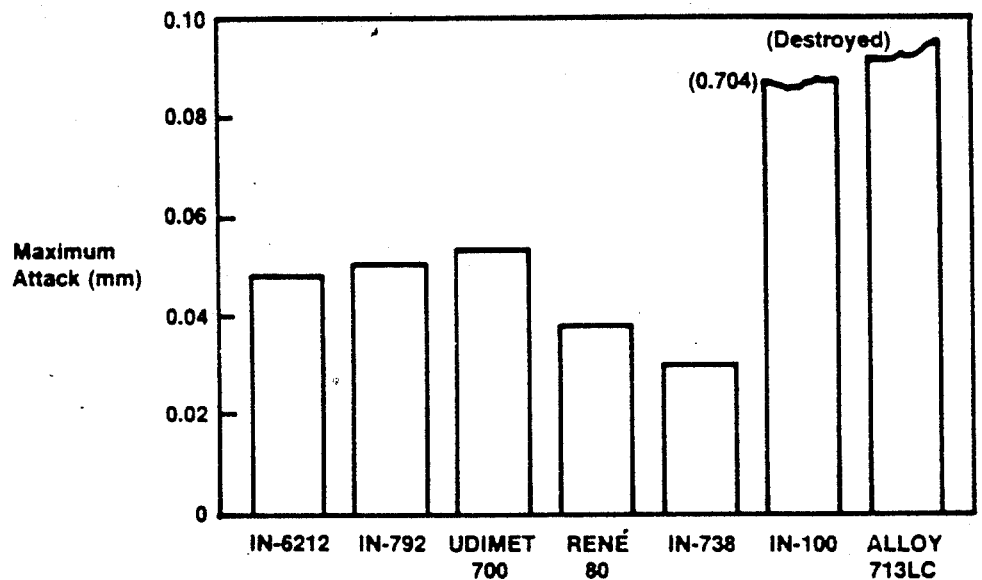
FIG. 12 is a chart of burner rig sulfidation tests performed on several nickel base alloys.
Figure 14:
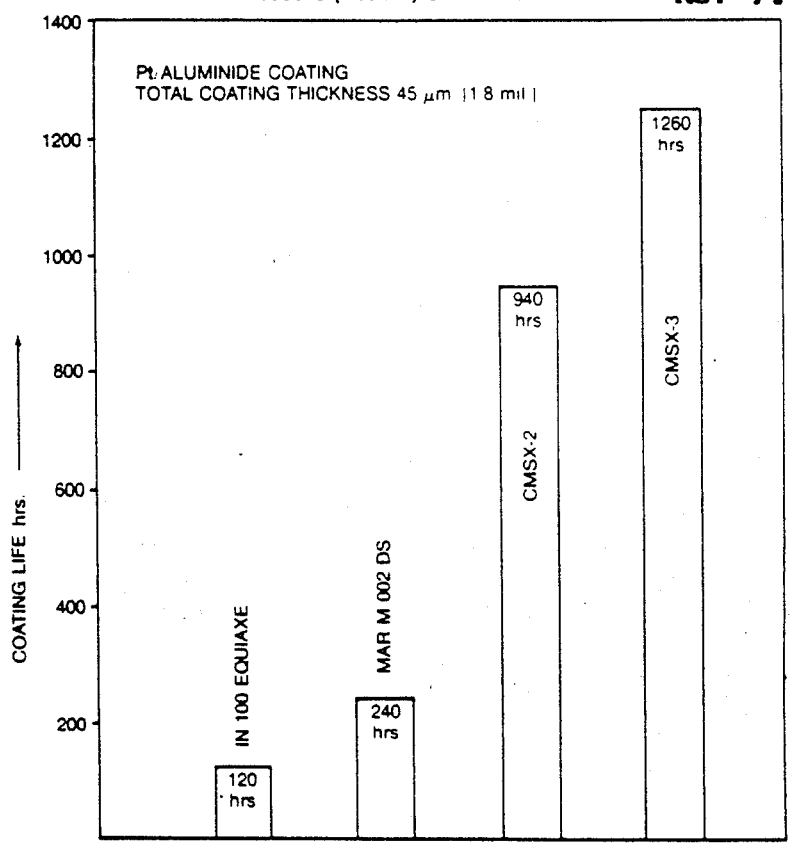
FIG. 14 is a comparison chart of the coating life characteristics of several nickel base alloys.

This is made clear by the burner rig sulfidation test results set out in FIG. 12. Included in objectives of the research which resulted in the development of the alloy of this invention, was to develop an alloy having to the maximum degree possible the improvement in environmental characteristics which have been exhibited by the new high density single crystal nickel base super alloys CMSX-2 and CMSX-3. Among these characteristics are the improvement in coating life as appears in FIG. 14. Tests are not yet complete but from the data developed to date, it is expected that the coating life of the low density alloy of this invention will be somewhere between NAR M 002DS and CMSX-2.

In view of these latter characteristics of the IN 100 alloy, it was decided to investigate another more recent alloy also developed by International Nickel, Alloy IN 6212. The alloy has a density of 0.289 lbs/cu. in. (8.02 gms/cc). Its nominal composition is (wt/%):

| C | 0.15 | Al | 4.50 |
|---|---|---|---|
| Cr | 12.0 | Ti | 4.70 |
| Co | 6.0 | B | 0.02 |
| Mo | 3.0 | Zr | 0.03 |
| W | 2.0 | Ni | Balance |

This alloy was chosen as a starting point for development of a low density alloy suitable for single crystal casting technology because its composition provides significantly better environmental properties, i.e. good resistance to sulfidation and oxidation.

The significant improvement in environmental characteristics provided by IN 6212 is clearly demonstrated by the results set out graphically in FIGS. 12 and 13. However, the alloy lacks the ability to withstand the solution heat treatment which is necessary for single crystal super alloy castings. The good environmental characteristics of IN 6212 alone were not enough to qualify it for aircraft engine turbine blade use as a single crystal alloy. Critical to the solution heat treatment requirement is the necessity of total gamma prime solutioning without incipient melting.

To increase the incipient melting point, C, B and Zr were all but entirely removed. This elimination goes beyond such procedures as selecting pure, elemental sources free of traces of these elements. The procedure includes the use of facilities such as vacuum induction melting equipment constructed of materials from which these elements will not migrate in any form at the operating temperatures of the equipment. Substantially closer control was also exercised to reduce N and O since these elements transfer non-metallic inclusions to single crystal components plus adversely affecting overall castability. This was accomplished utilizing the same procedures as used to control C, B and Zr contamination. V and W were all but eliminated and Hf and Ta were used.

These changes in composition were made in the hope of improving single crystal castability and environmental properties. Particularly was it hoped these changes would provide an alloy capable of resisting both corrosion and oxidation. The Al+Ti content was increased over that of In 6212. Cr was materially reduced from that of IN 6212. Co was reduced below that of IN 6212. Ta was substituted for W in the alloy composition. The result of these changes was a new and different alloy having an $N_{v3B}=2.25$ max.[PWA N-35] and having a density of 0.288 lbs/cu. in. (7.98 gms/cc) and the following nominal composition (wt/% or wt ppm):

| Cr | 9.8 | C | 33 ppm |
|---|---|---|---|
| Co | 5.0 | V | <10 ppm |
| Mo | 3.0 | B | <30 ppm |
| Al | 4.85 | Zr | <75 ppm |
| Ti | 4.75 | Hf | 0.11 |
| Ta | 2.0 | Al + Ti | 9.60 |
| W | <.02 | Ni | Balance |

A 235 lb heat (VF 559) of this alloy was prepared by vacuum induction melting, having the preceding nominal composition, including the following trace elements:
S: 5 ppm
N: 10 ppm
O: 9 ppm Two casting trials were conducted using the alloy of Heat VF 559. In both cases the product was a mold of single crystal castings, one produced by the use of a high thermal gradient casting process and the other by a lower thermal gradient casting process. Eight test bars, each 15 mm dia. by 150 mm long were produced by the high thermal gradient process and solid turbine blades were produced by the lower thermal gradient process.

Inspection of the test bars revealed no evidence of freckling or spurious grain/sliver defects. Non-destructive evaluation of the thirty solid blade castings established a 67% single crystal grain yield, a result comparable to that of initial trial castings with the lower thermal gradient process for other single crystal alloys such as that sold by Cannon-Muskegon Corporation under its trademark CMSX-2. The rejections were based upon the presence of freckling and the presence of slivers and bi-grains. Based upon initial experience with other single crystal super alloys, it is believed that these defects will be substantially reduced if not eliminated, by adjustment of the casting process to the alloy. These are time consuming procedures for which there has not been enough time to complete.

During the lower thermal gradient casting process, the liquidus temperature of the new alloy was determined by immersion of a thermocouple during heating and cooling through the liquidus. By this procedure it was determined that the liquidus was 2410° F. (1321°

C.). This compares with the liquidus of CMSX-2 which is 2516° F. (1380° C.). The single crystal test bars resulting from the high thermal gradient casting process were used for solution treatment evaluation. The as-cast microstructure of these bars is shown in FIGS. 1 and 1A and can be compared to the as-cast microstructure of CMSX-3 shown in FIGS. 2 and 2A. The as-cast alloy of this invention has a high volume fraction of gamma/-gamma prime eutectic and substantial interdendritic segregation.

The heat treatment studies were conducted in a Lindberg Globar tube furnace capable of maintaining its temperature within ±3° F. and led to the development of a three-step cycle for the alloy solution treatment:

3 hours at 2260° F. (1238° C.)
+3 hours at 2320° F. (1271° C.)
+3 hours at 2330° F. (1277° C.)

Figure 5:
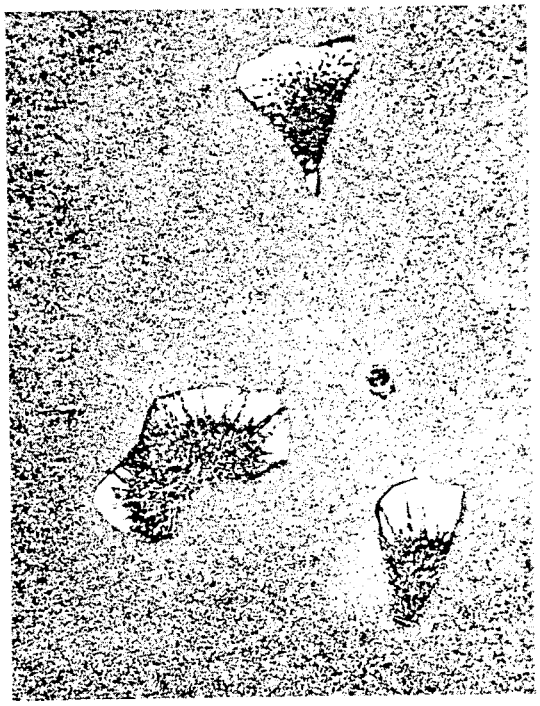
FIG. 5 is a photomicrograph of a test specimen after solution heat treatment from a single crystal test bar cast from the alloy of this invention, taken at 400X.
Figure 6:
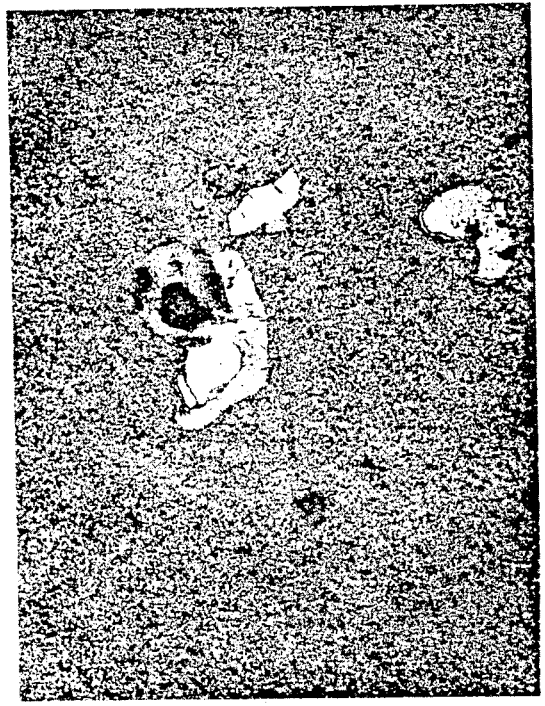
FIG. 6 is a photomicrograph similar to FIG. 5 but at a temperature high enough to initiate incipient melting, taken at 400X.

After the third step the bars were air cooled. Inspection of the microstructure of specimens subjected to all three steps revealed almost complete gamma prime solutioning and significant eutectic gamma/gamma prime solutioning with no incipient melting (FIGS. 3 and 3A, 4 and 4A). Inspection of specimens subjected to three hours at 2340° F. (1282° C.) in the third step revealed more extensive eutectic gamma/gamma prime solutioning without incipient melting (FIG. 5). When, however, the third step temperature was increased to 2350° F. (1288° C.) incipient melting occurred (FIG. 6). The 20° F. (11° C.) tolerance from the final third step to the incipient melting point is quite practical for modern production vacuum heat treatment furnaces which are qualified for single crystal super alloy solution treatment.

Testing was undertaken to verify that the three step solution heat treatment in conjunction with pseudo coating and aging cycles resulted in good stress and creep rupture strength for single crystal castings produced with this alloy. For the purpose of testing the creep rupture characteristics of the alloy, specimens were prepared from the 15 mm dia.×150 mm long single crystal bars by machining/grinding them to 0.126 inch diameter; 0.070 inch diameter for the stress rupture tests. 0.070 inch dia. stress rupture specimens were also machined from the single crystal turbine blade airfoils. The heat treatment of the bars and blades for these tests included the following steps:

3 hours at 2260° F. (1238° C.)
+3 hours at 2320° F. (1271° C.)
+3 hours at 2330° F. (1277° C.) air cooled
+4 hours at 1975° F. (1079° C.) air cooled
+20 hours at 1600° F. (871° C.) air cooled The tests were performed by Joliet Metallurgical Laboratories with the results of the longitudinal stress- and creep-rupture tests from the bars tabulated in Table I and of the longitudinal stress-rupture tests from the blades tabulated in Table II. In all cases the specimen longitudinal axes were within 10° of (001) orientation.

TABLE I

| Test Condition | Hrs. to Creep 1% | Hrs. to Creep 2% | Rupture Time Hrs. | El. % 4D | Ra % | P |
|---|---|---|---|---|---|---|
| (1400° F./98.6 ksi) | — | — | 567.9 | 17.8 | 25.3 | 42.32 |
| (760° C./679.8 MPa) | — | — | 304.9 | 17.9 | 28.3 | 41.82 |
| 1600° F./51.0 ksi | — | — | 475.6 | 25.9 | 34.9 | 46.72 |
| (871° C./351.6 MPa) | — | — | 620.8 | 21.4 | 32.3 | 46.95 |
| 1800° F./33.6 ksi | 19.7 | 35.0 | 73.9 | 32.7 | 46.0 | 49.42 |
| (982° C./231.7 MPa) | 16.5 | 33.5 | 74.1 | 33.3 | 46.3 | 49.42 |
| 1900° F./18.6 ksi | 136.0 | 546.0 | 587.7 | 11.8 | 36.1 | 53.74 |
| (1038° C./128.2 MPa) | 187.5 | 550.0 | 595.4 | 12.7 | 29.6 | 53.75 |
| 1922° F./21.756 ksi | 44.5 | 94.0 | 112.2 | 15.3 | 49.5 | 52.52 |
| (1050° C./150.0 MPa) | | | | | | |
| 2000° F./16.7 ksi | — | — | 65.9 | 12.4 | 38.3 | 53.67 |
| (1093° C./115.1 MPa) | | | | | | |

$P = (T + 460)[20 + \log_{10}(t)] \cdot 10^{-3}$

TABLE II

| Test Conditions | Rupture Time hrs | El. % 4D | Ra % | P |
|---|---|---|---|---|
| 1562°/75.42 ksi | 97.9 | 12.9 | 20.0 | 44.47 |
| (850° C./520.0 MPa) | 103.0 | 12.9 | 22.4 | 44.51 |
| 1922° F./21.756 ksi | 84.1 | 17.9 | 43.8 | 52.22 |
| (1050° C./150.0 MPa) | 86.9 | 15.7 | 43.8 | 52.26 |
| 2000° F./16.7 ksi | 76.6 | 12.8 | 46.0 | 53.84 |
| (1093° C./115.1 MPa) | 69.9+ | — | — | — |

+Thread failure.
$P = (T + 460)[20 + \log_{10}(t)] \cdot 10^{-3}$

The stress rupture properties, based upon tests conducted thus far, appear to be approximately the same as the density corrected average data established for CMSX-2 and −3 single crystal alloy (FIG. 7).

Figure 11:
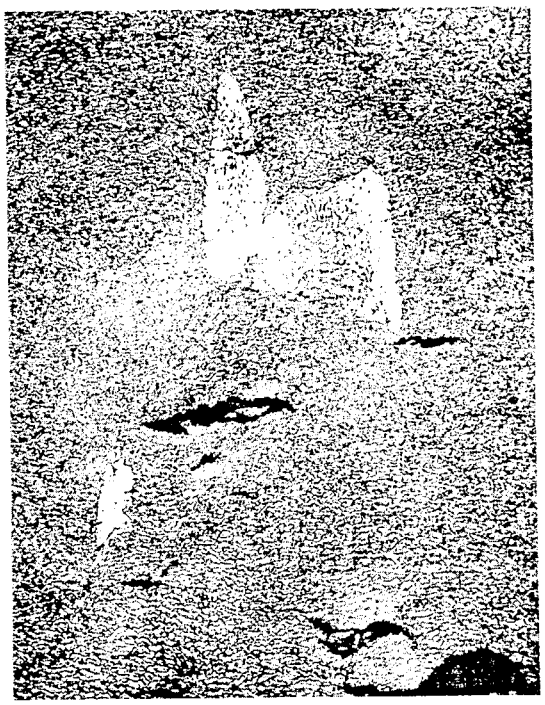
FIGS. 11 and 11A are photomicrographs of fully heat treated specimens from single crystal test bars cast from the alloy of this invention after stress rupture testing taken at 400X.
Figure 11A:
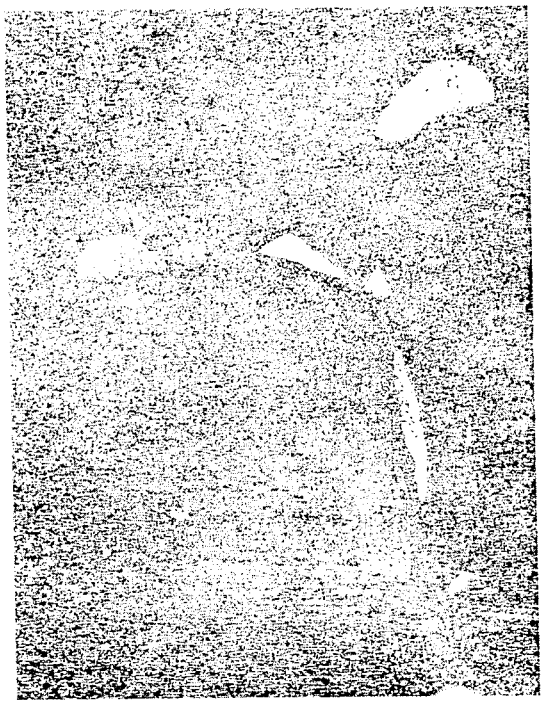
Figure 8:
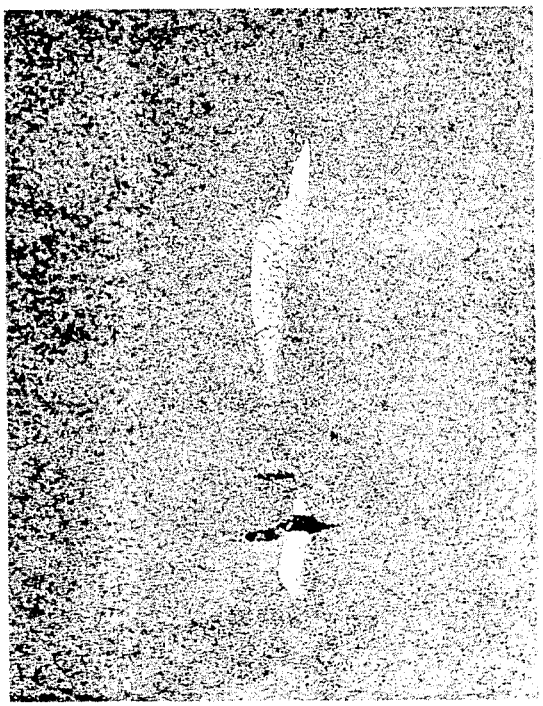
FIGS. 8 and 9 are photomicrographs of fully heat treated specimens from single crystal test bars cast from the alloy of this invention after stress rupture testing, taken at 400X.
Figure 9:
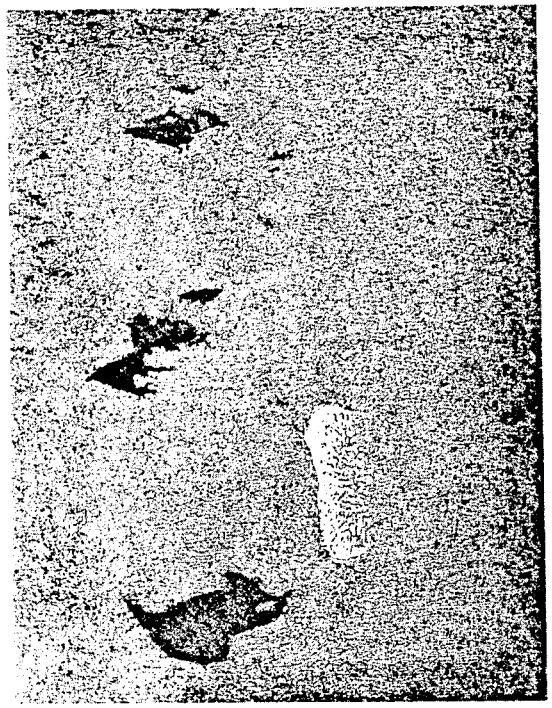
Figure 10:
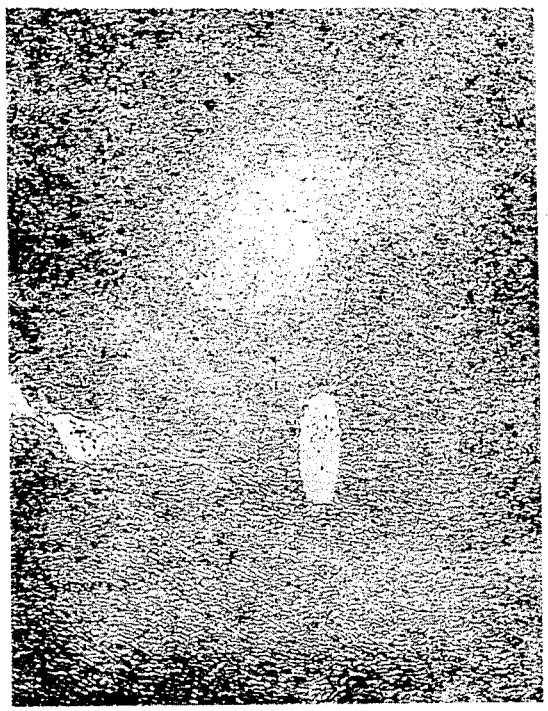
FIGS. 10 and 10A are photomicrographs of fully heat treated specimens from single crystal test bars cast from the alloy of this invention after stress rupture testing, taken at 400X.
Figure 10A:
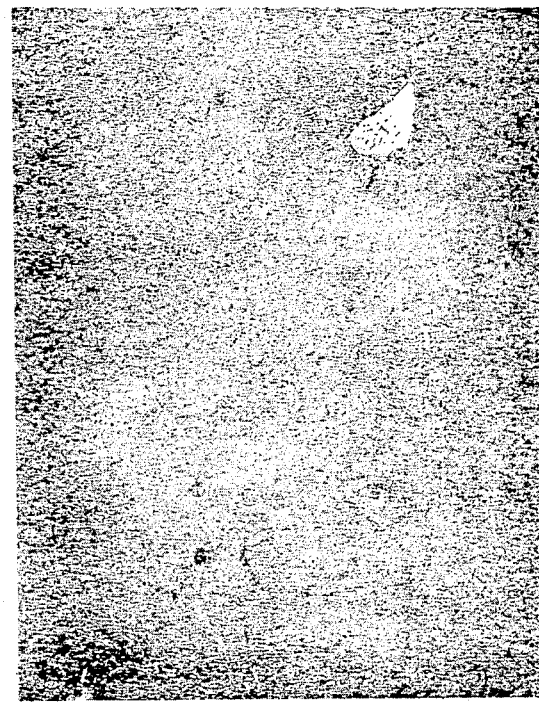

Examination was made of the specimens tested for stress- and creep-rupture to determine the microstructural stability of the alloy of this invention. Such examination indicated the alloy is completely stable. No deleterious phase formation was noted. No sigma phase needles were observed even after such a stringent condition as 51.0 ksi/1600° F. (351.6 MPa/870° C.) for 620.8 hrs. (FIG. 8). In all specimens there was notable gamma prime growth and a gradual change to raft-like morphology aligned perpendicular to the direction of the applied stress. Confirmation of this observation appears in the microphotos appearing as FIG. 9 [33.6 ksi/1800° F./74.1 hrs. (231.7 MPa/982° C.)]; FIGS. 10 and 10A [18.6 ksi/1900° F./595.4 hrs. (128.2 MPa/1038° C.)]; FIGS. 11 and 11A [16.7 ksi.2000° F./65.9 hrs. (115.1 MPa/1093° C.)].

The composition range of this alloy is very restricted and the limit of trace impurities must be carefully monitored to maintain the alloy's foundry, microstructural and environmental characteristics. This composition range is set out in the following table.

TABLE III

| Expressed as wt./% or wt. ppm $N_{v3B} = 2.25$ max) [PWA N-35] | |
|---|---|
| Cr | 9.5/10.3 |
| Co | 4.7/5.3 |
| Mo | 2.8/3.2 |
| Al | 4.7/4.9 |
| Ti | 4.6/4.8 |
| Ta | 1.8/2.2 |
| W | 0.10 max |
| C | 150 ppm max |
| V | 0.10 max |
| B | 50 ppm max |
| Zr | 100 ppm max |
| Hf | 0.0/0.12 |
| Al + Ti | 9.3/9.7 |
| Ni | Balance |
| Si | 0.05 max |
| Mn | 0.05 max |
| Fe | 0.25 max |
| Cb | 0.10 max |
| Cu | 0.01 max |
| N | 16 ppm max |

TABLE III-continued

Expressed as wt./% or wt. ppm
$N_{v3B} = 2.25$ max) [PWA N-35]

| | |
|---|---|
| O | 12 ppm max |
| S | 20 ppm max |
| Mg | 0.01 max |
| Pb | 2 ppm max |
| Ag | 2 ppm max |
| Bi | 0.3 ppm max |
| Se | 0.5 ppm max |
| Te | 0.3 ppm max |
| Tl | 0.3 ppm max |
| Ga | 25 ppm max |
| Cd | 2 ppm max |
| Sn | 25 ppm max |
| Zn | 5 ppm max |
| Na | 25 ppm max |
| K | 25 ppm max |
| Sb | 3 ppm max |
| Au | 2 ppm max |
| In | 2 ppm max |
| Ge | 2 ppm max |
| As | 5 ppm max |
| Hg | 3 ppm max |
| Th | 5 ppm max |
| U | 5 ppm max |

The numerous changes in alloy composition introduced by this invention have produced a new and improved alloy having characteristics not previously available. The alloy for the first time makes it feasible to rebuild older turbine engines to improve their efficiency without the danger of overstressing the engine structure by reason of increased alloy density and hence, component weight. At the same time an alloy has been created which retains those characteristics permitting its use in upgrading older turbine engines while providing many of the desirable and necessary foundry functional and environmental characteristics heretofore found only in new higher density single crystal super alloys which cannot be used in these engines.

We claim:

1. A single crystal turbine engine blade or vane characterized by its resistance to creep and microstructural stability when operated under high temperature, high stress conditions and capability of being heat treated to effect total solutioning of the gamma prime while maintaining a thermal differential of approximately 20° F. (11° C.) between the final solutioning temperature and the incipient melting temperature, cast from an alloy consisting essentially of the nominal composition (wt/% or wt ppm):

| | | | |
|---|---|---|---|
| Cr | 9.8 | C | 33 ppm |
| Co | 5.0 | V | <10 ppm |
| Mo | 3.0 | B | <30 ppm |
| Al | 4.85 | Zr | <75 ppm |
| Ti | 4.75 | Hf | .11 |
| Ta | 2.0 | Al + Ti | 9.60 |
| W | <.02 | Ni | Balance | and having a density of 0.288 lbs/cu. in. (7.98 gms/cc).

2. A single crystal turbine engine blade characterized by its resistance to creep and microstructural stability when operated under high temperature, high stress conditions and capability of being heat treated to effect total solutioning of the gamma prime and substantial solutioning of the gamma/gamma prime eutectic, while maintaining a thermal differential of approximately 20° F. (11° C.) between the final solutioning temperature and the incipient melting temperature cast from an alloy consisting essentially of the nominal composition (wt/% or wt ppm);

| | | | |
|---|---|---|---|
| Cr | 9.8 | C | 33 ppm |
| Co | 5.0 | V | <10 ppm |
| Mo | 3.0 | B | <30 ppm |
| Al | 4.85 | Zr | <75 ppm |
| Ti | 4.75 | Hf | 0.11 |
| Ta | 2.0 | Al + Ti | 9.60 |
| W | <.02 | Ni | Balance | and having a density of 0.288 lbs/cu. in. (7.98 gms/cc).

3. A single crystal turbine engine blade characterized by its resistance to creep and microstructural stability when operated under high temperature, high stress conditions and having a liquidus of 2410° F. (1321° C.) and totally solutioned gamma prime and substantially solutioned gamma/gamma prime eutectic after solutioning for three hours at 2260° F. (1238° C.) plus three hours at 2320° F. (1271° C.) plus three hours at 2330° F. (1272° C.) with total absence of incipient melting, cast from an alloy consisting essentially of the nominal composition (wt/% or wt ppm):

| | | | |
|---|---|---|---|
| Cr | 9.8 | C | 33 ppm |
| Co | 5.0 | V | <10 ppm |
| Mo | 3.0 | B | <30 ppm |
| Al | 4.85 | Zr | <75 ppm |
| Ti | 4.75 | Hf | 0.11 |
| Ta | 2.0 | Al + Ti | 9.60 |
| W | <.02 | Ni | Balance | and having a density of 0.188 lbs/cu. in.

4. A single crystal turbine engine blade or vane characterized by a density of 0.288 lb/cu. in., (7.98 gms/cc) its resistance to creep and microstructural stability under an operating condition equivalent to 51.0 ksi/1600° F. (351.6 MPa/870° C.) for 620.8 hrs. after solutioning sufficient to totally solution its gamma prime and substantially solution its gamma/gamma prime eutectic without any incipient melting, cast from an alloy consisting essentially of the composition:

| | |
|---|---|
| Cr | 9.5/10.3 |
| Co | 4.7/5.3 |
| Mo | 2.8/3.2 |
| Al | 4.7/4.9 |
| Ti | 4.6/4.8 |
| Ta | 1.8/2.2 |
| W | 0.10 max |
| C | 150 ppm max |
| V | 0.10 max |
| B | 50 ppm max |
| Zr | 100 ppm max |
| Hf | 0.0/0.12 |
| Al + Ti | 9.3/9.7 |
| Ni | Balance |
| Si | 0.05 max |
| Mn | 0.05 max |
| Fe | 0.25 max |
| Cb | 0.10 max |
| Cu | 0.01 max |
| N | 16 ppm max |
| O | 12 ppm max |
| S | 20 ppm max |
| Mg | 0.01 max |
| Pb | 2 ppm max |
| Ag | 2 ppm max |
| Bi | 0.3 ppm max |
| Se | 0.5 ppm max |
| Te | 0.3 ppm max |
| Tl | 0.3 ppm max |
| Ga | 25 ppm max |

-continued

| | |
|---|---|
| Cd | 2 ppm max |
| Sn | 25 ppm max |
| Zn | 5 ppm max |
| Na | 25 ppm max |
| K | 25 ppm max |
| Sb | 3 ppm max |

-continued

| | |
|---|---|
| Au | 2 ppm max |
| In | 2 ppm max |
| Ge | 2 ppm max |
| As | 5 ppm max |
| Hg | 3 ppm max |
| Th | 5 ppm max |
| U | 5 ppm max |

* * * * *